United States Patent [19]
Park et al.

[11] Patent Number: 4,760,349
[45] Date of Patent: Jul. 26, 1988

[54] CMOS ANALOG STANDARD CELL ARRAYS USING LINEAR TRANSCONDUCTANCE ELEMENTS

[75] Inventors: Chin-Sup Park, St. Paul; Rolf Schaumann, Minnetonka, both of Minn.

[73] Assignee: Regents of the University of Minnesota, Minneapolis, Minn.

[21] Appl. No.: 898,181

[22] Filed: Aug. 19, 1986

[51] Int. Cl.$^4$ ............................................. H03F 3/26
[52] U.S. Cl. ................... 330/264; 330/277; 330/278; 330/307; 357/42; 357/45
[58] Field of Search ............... 330/253, 264, 278, 277, 330/307; 307/451, 452, 579, 585; 357/42, 45

[56] References Cited

U.S. PATENT DOCUMENTS

| | | | |
|---|---|---|---|
| 4,021,747 | 5/1977 | Todokoro | 330/264 X |
| 4,352,073 | 9/1982 | Leuthold | 330/264 |
| 4,520,324 | 5/1985 | Jett, Jr. et al. | 330/253 X |
| 4,641,108 | 2/1987 | Gill, Jr. | 357/45 X |

OTHER PUBLICATIONS

"Design of Linear CMOS Transconductance Elements," by A. Nedungadi and T. R. Viswanathan, *IEEE Transactions on Circuits and Systems*, vol. CAS-31, No. 10, 10/84.
"Potential of MOS Technologies for Analog Integrated Circuits," by D. A. Hodges, P. R. Gray and R. W. Brodersen, *IEEE Journal of Solid State Circuits*, vol. SC-13, No. 3, Jun. 1978.
"An Integrable Precision voltage-to-Current Converter with Bilateral Capability", S. Pookaiyaudom and W. Surakampontorn, *IEEE Journal of Solid State Circuits*, vol. SC-13, No. 3, Jun. 1978.
Excerpt from textbook Analysis and Design of Analog Integrated Circuits, 2d Ed., by Gray and Meyer, published 1984.
"High-Frequency CMOS Active RC Filters," by R. Schaumann and F. J. Fernandez, published in the proceedings of the International Converence on Circuits and Systems, Beijing China, Jun. 1985 (pp. 349–352).
"A Ratio-Independent Algorithmic Analog-to-Digital Conversion Technique," by P. W. Li, M. J. Chin, P. R. Gray and R. Castello, *IEEE Journal of Solid State Circuits*, vol. SC-19, No. 6, Dec. 1984.
"Genesis 7600 Semi-Custom IC", by Cherry Semiconductor, May 1985.
"Linear Semi-Custom Programs," by Cherry Semiconductor.
"UCLA-1 Universal CMOS Linear Array," to Universal Semiconductor, Inc., Jun. 1985.
"RLA120 Linear Macrocell Array," by Raytheon Company Semiconductor Division, Mar. 1985.
"Linear Integrated Circuits CA3600E," to RCA Solid State Division, printed Nov. 1973.

*Primary Examiner*—James B. Mullins
*Attorney, Agent, or Firm*—Merchant, Gould, Smith, Edell, Welter & Schmidt

[57] ABSTRACT

A simple four-transistor CMOS linear, tunable, high-frequency transconductance element is applied to the design of analog standard cell arrays for semi-custom design of analog circuits. By substituting a pair of composited n-channel/p-channel devices for each transistor in a CMOS inverter circuit, the transconductance circuit achieves its linearity by current differencing without undue matching requirements. The linearity and frequency response is optimized by appropriate choice of device dimensions. The transconductance element is used as an elementary building block which forms the basis of a standard cell library for use in semi-custom analog circuit applications. Various analog circuits are realized by interconnecting a number of the transconductance elements in order to achieve a highly systematic design in chip layout along with high functional density.

24 Claims, 11 Drawing Sheets

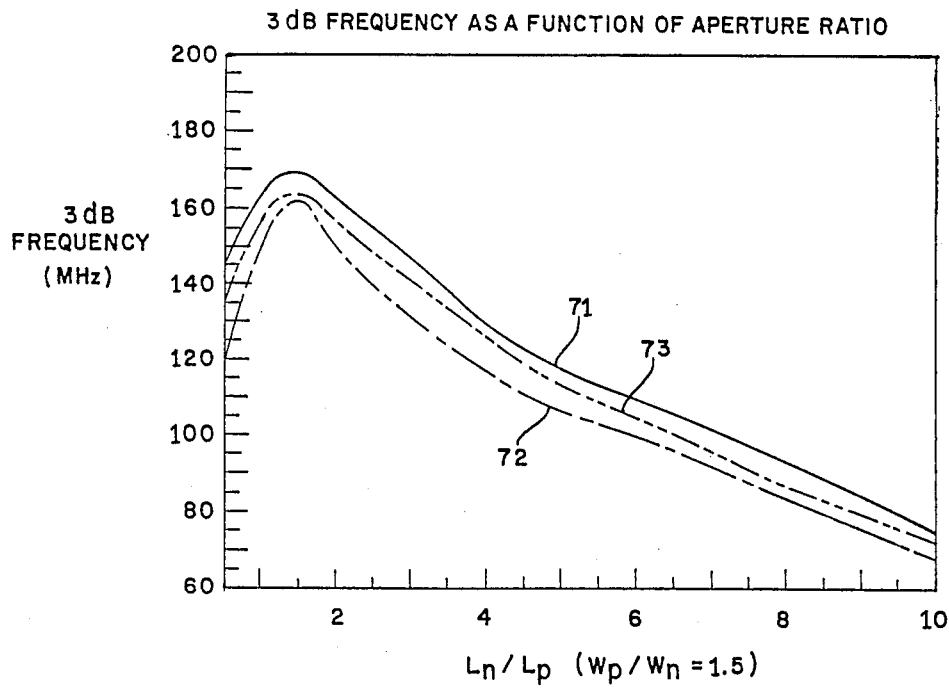
Fig. 7
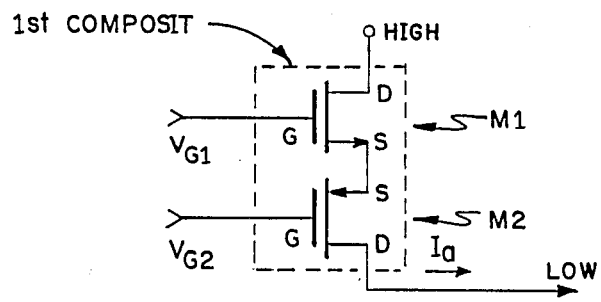
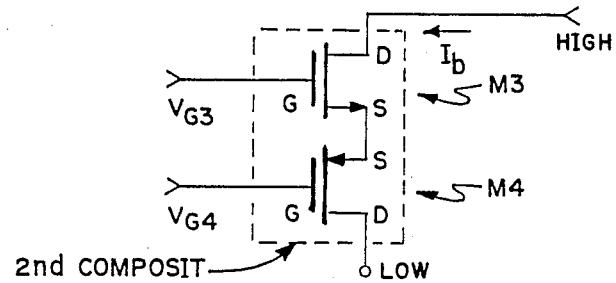
Fig. 3a

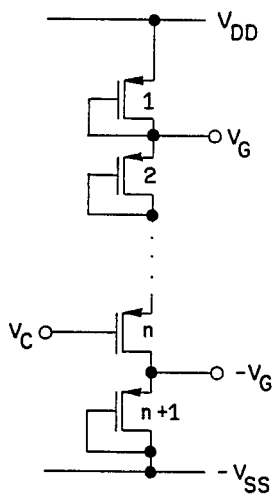
Fig. 9
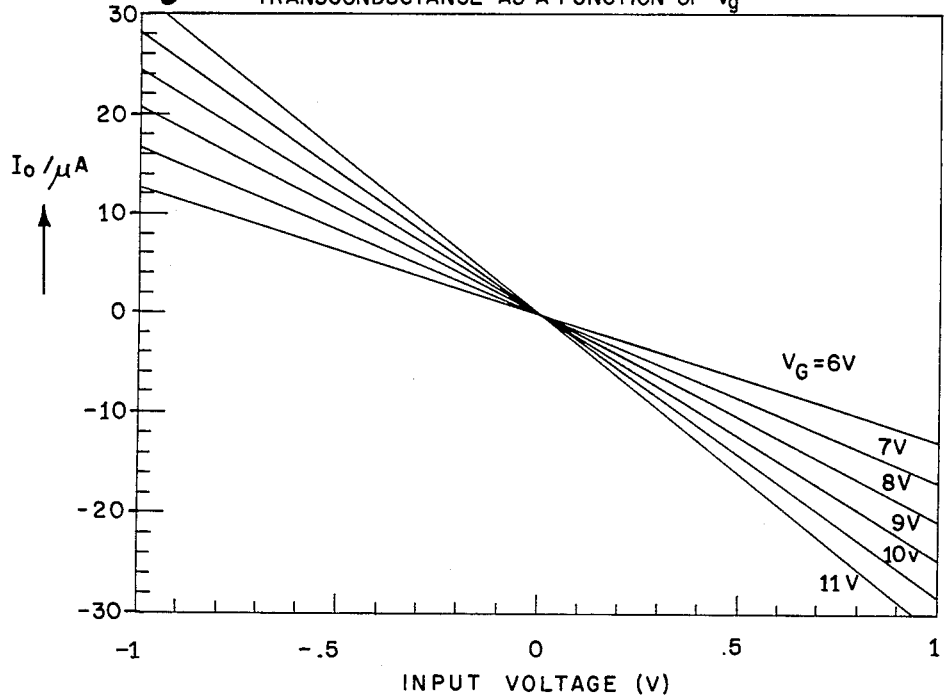
Fig. 10 TRANSCONDUCTANCE AS A FUNCTION OF $V_g$

CMOS ANALOG STANDARD CELL ARRAYS USING LINEAR TRANSCONDUCTANCE ELEMENTS

This invention was made with Government support under Grant No. ECS 82-15001 awarded by the National Science Foundation. The Government has certain rights in this invention.

BACKGROUND OF THE INVENTION

Integrated analog signal processing systems are inherently encumbered by custom specifications which if implemented in VLSI (Very Large Scale Integration) designs require costly custom design and fabrication. In contrast, VLSI digital systems are easily implemented in less than full custom designs (e.g., semi-custom and gate arrays) due to the highly structured and repetitive use of elementary logic building blocks. The elementary digital logic blocks can be systematically arranged in regular array structures which can be customized to the required application by interconnecting the elementary digital logic blocks to create the required function. If a standard analog building block can be found which lends itself to implementing a wide variety of analog implementations, a standard cell design for analog circuits can be implemented allowing customized VLSI designs by interconnecting a number of elementary linear analog cells in order to achieve a highly systematic design and chip layout with high functional density.

Transconductance elements or voltage-to-current transducers (VCTs) are essential elements of a wide range of analog signal processing circuits. In order for them to be effective, transconductance elements must operate in a linear fashion across a wide input voltage range. Single MOSFET (Metal-Oxide-Semiconductor Field Effect Transistor) transistors will act as VCTs but the output current exhibits a non-linear square-law relationship to the input voltage. Multiple transistor linear transconductance elements have been achieved through several approaches by various circuit techniques which compensate for the non-linear term of the basic transistor I-V relationship. These designs have typically required many transistors and consume large amounts of chip surface area.

Bipolar transconductance elements have been used as the basic building blocks in such circuits as operational amplifiers, comparators, and other analog signal processing circuits. MOS technology is, however, more attractive for VLSI semi-custom designs due to its simpler fabrication requirements and higher packing density than bipolar technology. CMOS (Complementary Metal-Oxide-Semiconductor) technology offers the additional advantage of complementary devices and lower power operation.

Prior art linear transconductance elements implemented in CMOS technology have achieved linear operation over a limited voltage range by linearizing a CMOS differential stage using current differencing so that the nonlinear term of the CMOS transistor I-V curve is eliminated. This approach shown in FIG. 1 provides a fairly high gain linear VCT but at a cost of increased chip surface area usage due to the use of many transistors. Several constant current sources are required to provide the current biasing of the circuit which results in a linear VCT implemented in approximately 10 transistors at a minimum.

Simple linear VCTs have been constructed based on using the well-known CMOS inverter by critically matching the gain parameters of the p-MOS and n-MOS transistors in the fabrication of the circuit as shown in FIG. 2. The advantage here is the elimination of the requirement of constant current sources. Unfortunately, power-supply rejection is very poor, the transconductance cannot be tuned, and a very limited linearity has been achieved in practice due to the difficulty of matching the gain constants ($\mu C_{ox}W/L$) between the p-MOS and n-MOS transistors. The gain of a p-MOS or n-MOS transistor depends on the physical width-to-length ratio W/L of the gate area, the gate oxide capacitance $C_{ox}$ per unit area, and the effective mobility $\mu$ of the charge carriers. Since the effective mobility of electron charge carriers is much greater than the effective mobility of hole charge carriers, the gain constant for an n-MOS transistor is much greater than the gain constant of a p-MOS transistor of the same device dimensions. Therefore the gain of the n-MOS and p-MOS transistors can only be matched by using exact ratios of the width-to-length dimensions of the gates. Since the effective mobility of the charge carriers depends upon doping, bias voltages and temperature, good matching between the p-MOS and n-MOS devices will be difficult to achieve in practice.

To alleviate these difficulties, and to provide for a simple CMOS transconductance element which can be used in regular analog arrays, a linear tunable VCT with as few as four transistors is described. The operation of this VCT resembles in many respects that of the CMOS inverter but without the aforementioned matching problems and with the additional advantages of tunability and superior power-supply rejection. The circuit is constructed by replacing each transistor in the CMOS inverter by a p-channel/n-channel pair of MOSFETs, where the gain of the circuit is tunable by applying fixed reference voltages.

SUMMARY OF THE INVENTION

An improved linear transconductance circuit is described which is comprised of a pair of composite transistors and of a means to achieve current differencing, where each of the composites is constructed using an n-channel p-channel pair of field effect transistors (FETs) such that the source terminals of the two transistors are connected. The transconductance parameter is tuned by means of a tuning voltage connected to one of the gate terminals of each composite transistor. The tuning voltage is used to bias the assembly of two composite transistors such that it operates linearly. Both composite transistors are connected such that the drain terminal of the n-type FET is connected to a high supply voltage, while the drain terminal of the p-type FET is connected to a low supply voltage. The voltage control signal input is connected to the other unused gate on each of the composite transistors. The difference between the currents is the upper and lower composite transistors forms the linear current output which is controlled by the tuning voltage and is proportional to the signal voltage input.

The present linear VCT is applicable to forming standard cell arrays of VCTs which can be customized to implement different circuit configurations merely by overlaying metal mask layers to connect the components. An array of this type would include uncommitted transistors, I/O circuits and capacitors to aid in the implementation of various linear circuit applications.

The top metal layer is the final fabrication step, which is the only step needed to customize the linear circuit to a particular application.

Accordingly, a tunable voltage to current transducer that exhibits a high degree of linearity is described. This VCT is constructed from two composite transistors and current differencing circuitry. The composite transistors are constructed from a pair of n-MOS/p-MOS FETs with one of the gates acting in each composite transistor as a tuning input for controlling linear operation of the composite.

BRIEF DESCRIPTION OF THE DRAWINGS

In the drawings of the preferred embodiment of the present invention, wherein like numerals refer to like elements throughout the several views.

FIG. 3a shows the construction of the composite transistors and their connections.

FIG. 7 shows the 3dB-frequency of the circuits in FIGS. 3b and 3c using the small signal model in FIG. 6 plotted for various device dimensions.

FIG. 9 shows a schematic diagram of a method of obtaining $V_G$ and $-V_G$ for controlling the gain of the circuit described in FIGS. 3b and 3c.

FIG. 10 describes the variation of short circuit output current when $V_G$ is varied.

DETAILED DESCRIPTION OF THE TRANSCONDUCTANCE ELEMENT

FIG. 3a shows the two composite devices essential to the construction of the linear tunable high-frequency transconductance element. The transistors are labelled $M_1$, $M_2$, $M_3$, and $M_4$, where $M_1$ and $M_3$ are n-MOSFET devices and $M_2$ and $M_4$ are p-MOSFET devices. Transistors $M_1$ and $M_2$ form a composite transistor, and transistors $M_3$ and $M_4$ form a second composite transistor. One of the gate inputs, $V_{G1}$ or $V_{G2}$, to the first composite transistor is used as the signal input while the other gate input is used for tuning and biasing. The signal source input and the tuning voltage input are interchangeable on the two gates. The same is true of the second composite transistor where $V_{G3}$ and $V_{G4}$ are the gate inputs. Either $V_{G3}$ or $V_{G4}$ can be used for tuning and biasing while the other input is used as the signal input.

In the preferred embodiment described below, $V_{G1}$ and $V_{G4}$ are the tuning voltage inputs while $V_{G2}$ and $V_{G3}$ are used as the signal control voltage input to the VCI. The drain of $M_1$ is connected to a positive supply voltage source while the drain of $M_4$ is connected to a negative supply voltage source. The lower drain of the first composite transistor shown in FIG. 3a sources current according to the signal control voltage presented on $V_{G1}$. The drain terminal on transistor $M_3$ in the second composite transistor likewise sinks a current determined by the amount of signal voltage appearing on $V_{G4}$. The current difference between the first composite transistor and the second composite transistor forms the current output of the device. In FIG. 3a, the current differencing circuitry is not shown and could be formed using current mirrors or other devices, or the outputs could simply be wired together to form a single differencing output. A plurality of VCT circuits based on FIG. 3a can be implemented in a regular array structure of standard cells with each of the aforementioned terminals, i.e., $V_{G1}$, $V_{G2}$, $V_{G3}$, $V_{G4}$, and the current outputs left unconnected. This regular array can be used to implement various analog devices by interconnecting the VCT elements with other elements such as resistors and capacitors to achieve the desired function. The interconnection of the VCT elements with the other components can be accomplished by a simple process of adding one or more layers of metal interconnect over the top of the prefabricated array. The array could include appropriate I/O circuits, analog switches, and other support devices that would be needed to implement a wide variety of analog applications.

Figure 1:
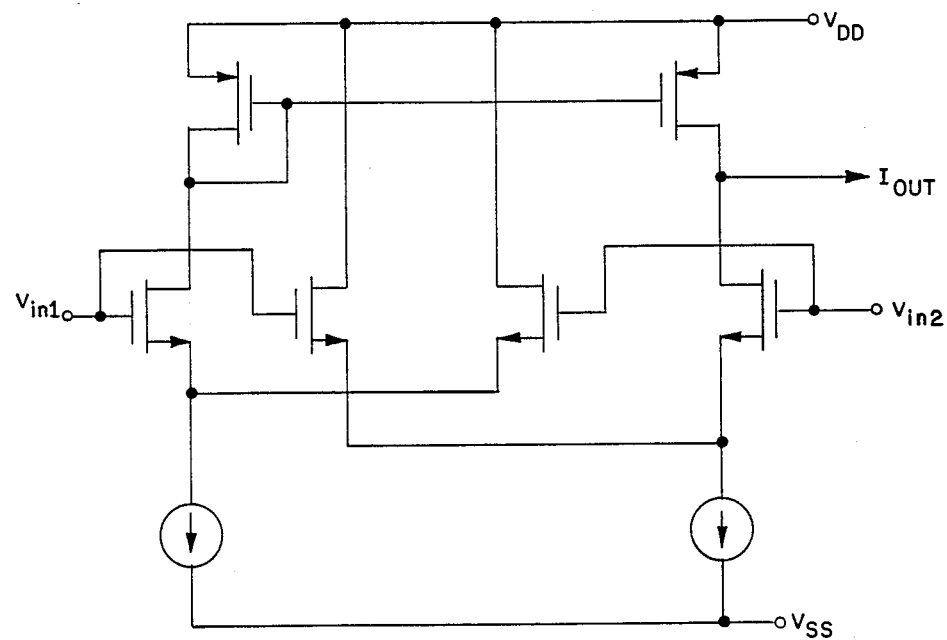
FIG. 1 is a prior art transconductance element using current differencing and constant current sources.
Figure 2:
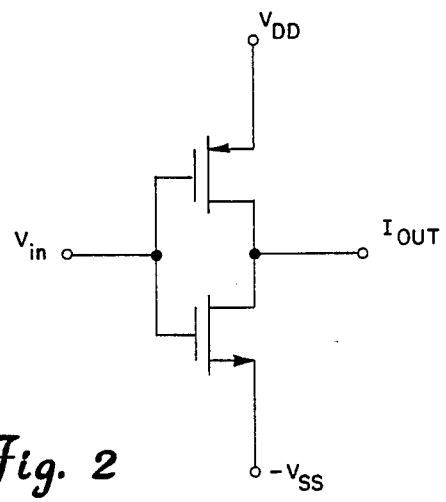
FIG. 2 is another prior art transconductance element based on the simple CMOS inverter.
Figure 3B:
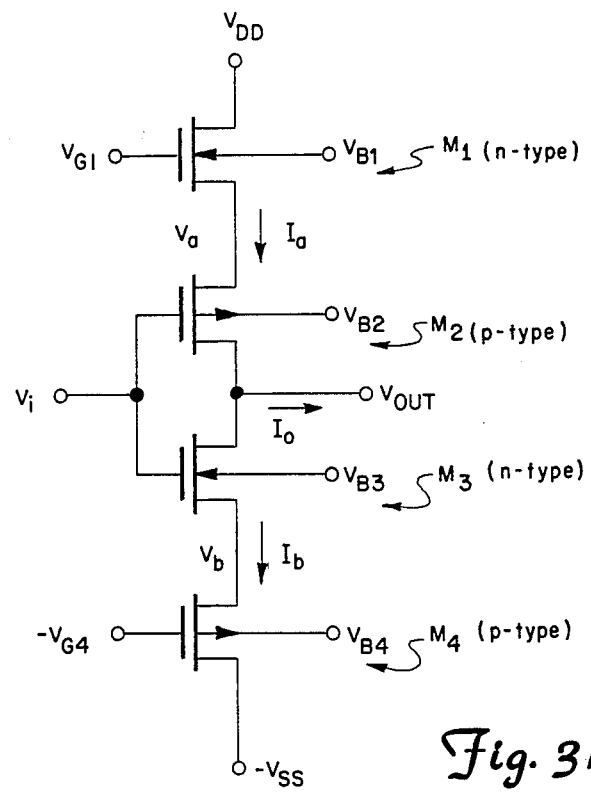
FIG. 3b is a schematic diagram of the preferred embodiment of the transconductance element which is the subject of the present invention. The substrate connections are shown using one form of standard notation for MOS technology.
Figure 3C:
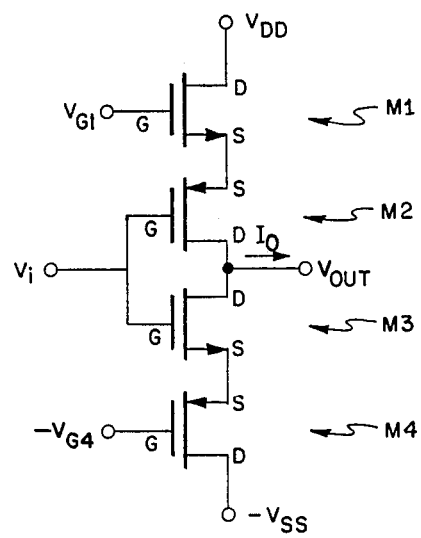
FIG. 3c is another schematic diagram of the preferred embodiment of the present invention using a different notation standard for MOS technology. The source terminals on the MOS transistors are indicated by arrows and the direction of the arrows indicates the type of MOS transistor. An arrow on the source terminal pointing toward the gate terminal indicates a p-channel MOS transistor. An arrow on the source terminal pointing away from the gate terminal indicates an n-channel MOS transistor.

The preferred embodiment of the simple VCT is shown in FIGS. 3b and 3c; it uses only four devices, two matched p-MOS and two matched n-MOS transistors that are used as two p-channel/n-channel pairs. All transistors are enhancement mode devices biased in saturation. Assuming approximate matching between the n-MOS devices $M_1$, $M_3$, and between the p-MOS devices $M_2$, $M_4$, and using the standard square-law model for MOS devices in their saturation region, the currents $I_a$ and $I_b$ defined in FIG. 3b are easily derived as $$I_a = k_{eff}(V_{G1} - V_i - V_{Tn1} - |V_{Tp2}|)^2 \tag{1a}$$

$$I_b = k_{eff}(V_i + V_{G4} - V_{Tn3} - |V_{Tp4}|)^2 \tag{1b}$$

where $$k_{eff} = k_n k_p / (\sqrt{k_n} + \sqrt{k_p})^2, \quad (2)$$

$$i_{n,p} = \frac{1}{2}[\mu_{eff} C_{ox}(W/L)]_{n,p}, \quad (3)$$

where $\mu_{eff}$ is the effective mobility of the charge carriers, $C_{ox}$ the gate oxide capacitance per unit area, W/L the gate width-to-length ratio of the various devices, and $V_{Tn1}$, $V_{Tn3} > 0$, $V_{Tp2}$, $V_{Tp4} < 0$ are the threshold voltages of the corresponding devices. Thus, with equation (1), the output current, $I_o = I_a - I_b$, equals $$I_o = -2k_{eff}[V_{G1} + V_{G4} - \Sigma V_T]V_i + k_{eff}[V_{G1} + V_{G4} - \Sigma V_T]\Delta V_T. \quad (4)$$

where the abbreviations $$\Sigma V_T = V_{Tn1} + V_{Tn3} + |V_{Tp2}| + |V_{Tp4}| \quad (5a)$$

$$\Delta V_T = (V_{Tn3} - V_{Tn1}) + (|V_{Tp4}| - |V_{Tp2}|) + (V_{G1} - V_{G4}) \quad (5b)$$

were introduced for the sum and the difference of the threshold voltages, respectively. If the back gate or body effect can be neglected and $V_{G1} = V_{G4} = V_G$, $\Delta V_T$ will be zero so that, by equation (4), the curcuit implements an ideal linear VCT, $I_o = -g_{mT}V_i$, where $$g_{mT} = 2k_{eff}(2V_G - \Sigma V_T) \quad (6)$$

is the total transconductance parameter that can be tuned by varying the gate bias voltage $V_G$. As explained in the following, $V_{G1}$ and $V_{G4}$ do not necessarily have to be equal for best linearity.

For the devices to stay in their saturation region, as was assumed in the derivation of equation (4), the conditions $V_{DS} > V_{GS} - V_{Tn}$ for n-channel and $V_{SD} > V_{SG} - |V_{Tp}|$ for p-channel devices must be satisfied. This leads to the requirements $$-|V_{Tp2}| < V_i - V_o < V_{Tn3} \quad (7a)$$

$$V_{DD} > V_G - V_{Tn1}; \quad -V_{ss} > -V_G + |V_{Tp4}| \quad (7b)$$

in addition to $$V_G - V_i > V_{Tn1} + |V_{Tp2}| \quad (7c)$$

$$V_i - (-V_G) > V_{Tn3} + |V_{Tp4}| \quad (7d)$$

to keep all devices on. It is the appropriate choice of $V_{G1}$ and $V_{G4}$ [$V_G$ in equation (7)] that causes the VCT to operate linearly. By equation (7a), the limits on linear operation are determined mainly by the threshold voltages of $M_2$ and $M_3$, and thus can be extended by increasing $V_{Tp2}$ and $V_{Tn3}$. Without changing the CMOS fabrication process this may be achieved artificially by connecting DC voltage sources $V_{zp}$ and $V_{zn}$ between the input terminal $V_i$ and the gates of $M_2$ and $M_3$, respectively. Practical methods of implementing such level-shifting circuits are known to those skilled in the art.

BODY EFFECT

The body effect is the effect on channel conductivity due to source-to-substrate biasing. As is known to those skilled in the art, body effect cannot be ignored but must be compensated for in order to create a linear transconductance element. Eliminating the body effect can be done through several methods, such as placing each transistor in its own tub or well; using SOS (silicon-on-sapphire) technology; creating an appropriate substrate bias; or doing accurate width-to-length ratioing of the device dimensions.

The circuit in FIG. 3b implements an ideal linear transconductance $g_{mT}$, given by equation (6), with no DC offset provided that all source-to-substrate voltages, $V_{SBi} = V_{Si} - V_{Bi}$, i=1, ..., 4, in FIG. 3b are zero. This ideal situation may be achievable with an SOS (silicon-on-sapphire) or a twin-tub CMOS fabrication process. However, placing both the n-MOS and p-MOS transistors in their own well is an additional complication in the CMOS fabrication process that is best avoided if possible for cost and yield considerations.

In this disclosure, a p-type bulk or substrate is assumed with the p-MOS transistors placed in n-wells and the n-channel devices residing directly on the p-substrate. However, those skilled in the art will recognize that an n-type bulk may be used with n-MOS transistors placed in p-wells. Assuming then that $V_{SB}$ is not equal to zero for all devices, the body effect must be taken into consideration.

Including body effect, the threshold voltages for p- and n-channel devices, respectively, can be written as $$V_{Tp} = V_{Tpo} - \gamma_p(\sqrt{-V_{SB} + 2|\phi_n|} - \sqrt{2|\phi_n|}) \quad (8a)$$

$$V_{Tn} = V_{Tno} + \gamma_n(\sqrt{V_{SB} + 2\phi_p} - \sqrt{2\phi_p}) \quad (8b)$$

where $\gamma_{n,p} > 0$ are the body effect coefficients, $V_{Tp,no}$ are the threshold voltages for $V_{SB} = 0$, and $\phi_{n,p}$ are the bulk potentials. It is easy to show that the voltages $V_{S1} = V_{S2} = V_a$ and $V_{S3} = V_{S4} = V_b$ in FIG. 3b are $$V_a = \frac{\sqrt{k_n}(V_{G1} - V_{Tn1}) + \sqrt{k_p}|V_{Tp2}|}{\sqrt{k_n} + \sqrt{k_p}} + \frac{\sqrt{k_p}}{\sqrt{k_n} + \sqrt{k_p}} V_i \quad (9a)$$

$$= V_{ao} + \alpha V_i$$

$$V_b = -\frac{\sqrt{k_p}(V_{G4} - |V_{Tp4}|) + \sqrt{k_n} V_{Tn3}}{\sqrt{k_n} + \sqrt{k_p}} + \frac{\sqrt{k_n}}{\sqrt{k_n} + \sqrt{k_p}} V_i \quad (9b)$$

$$= -V_{bo} + (1 - \alpha)V_i$$

where $$\alpha = \sqrt{k_p} / (\sqrt{k_n} + \sqrt{k_p})$$

and $k_{n,p}$ was defined in equation (3). Assuming for concreteness in the following an n-well process as discussed above, and setting $V_{B1} = V_{B3} = -V_{SS}$, it can be shown by inserting equation (8) and equation (9) into equation (5), that $$\Delta V_T \simeq (V_{G1} - V_{G4}) - \gamma_n [\sqrt{V_{SS} + V_{ao} + 2\phi_p} - \sqrt{V_{SS} - V_{bo} + 2\phi_p}] + \gamma_p [\sqrt{V_{B4} + V_{bo} + 2|\phi_n|} - \sqrt{V_{B2} - V_{ao} + 2|\phi_n|}] + \frac{V_i}{2} \left\{ \gamma_n \left[ \frac{1-\alpha}{\sqrt{V_{SS} - V_{bo} + 2\phi_p}} - \frac{\alpha}{\sqrt{V_{SS} + V_{ao} + 2\phi_p}} \right] - \gamma_p \left[ \frac{(1-\alpha)}{\sqrt{V_{B4} + V_{bo} + 2|\phi_n|}} - \frac{\alpha}{\sqrt{V_{B2} - V_{ao} + 2|\phi_n|}} \right] \right\}$$

$$= \Delta V_{To} + \frac{p}{2} V_i \qquad (10a)$$

$$\Sigma V_T \simeq 2[V_{Tno} + |V_{Tpo}| - \gamma_n \sqrt{2\phi_p} - \gamma_p \sqrt{2|\phi_n|}] + \gamma_n [\sqrt{V_{SS} + V_{ao} + 2\phi_p} + \sqrt{V_{SS} - V_{bo} + 2\phi_p}] + \gamma_p [\sqrt{V_{B2} - V_{ao} + 2|\phi_n|} + \sqrt{V_{B4} + V_{bo} + 2|\phi_n|}] + \frac{V_i}{2} \left\{ \gamma_n \left[ \frac{\alpha}{\sqrt{V_{SS} + V_{ao} + 2\phi_p}} + \frac{1-\alpha}{\sqrt{V_{SS} - V_{bo} + 2\phi_p}} \right] - \gamma_p \left[ \frac{1-\alpha}{\sqrt{V_{B4} + V_{bo} + 2|\phi_n|}} + \frac{\alpha}{\sqrt{V_{B2} - V_{ao} + 2|\phi_n|}} \right] \right\}$$

$$= \Sigma V_{To} + \frac{q}{2} V_i \qquad (10b)$$

In equation (10a,b), the approximation $\sqrt{x_o \pm x} \simeq \sqrt{x_o}(1 \pm 0.5 x/x_o)$, for $x < x_o$, has been used and the definitions for p, q, $\Delta V_{To}$ and $\Sigma V_{To}$ are evident. Clearly, from equation (10) and equation (4) body effect results not only in DC offset but also causes $\Sigma V_T$ and $\Delta V_T$ to depend on $V_i$, so that $I_o$ is a nonlinear function of $V_i$.

For applications requiring extreme linearity, the influence of body effect must be eliminated, a result that can be achieved by W/L ratioing or by appropriate biasing schemes. An easy solution, as revealed by equation (10), consists of setting $$V_{B4} = (\gamma_p/\gamma_n)^2(V_{SS} - V_{bo} + 2\phi_p) - V_{bo} - 2|\phi_n| \qquad (11a)$$

$$V_{B2} = (\gamma_p/\gamma_n)^2(V_{SS} + V_{ao} + 2\phi_p) + V_{ao} - 2|\phi_n|, \qquad (11b)$$

which results in both $\Sigma V_T$ and $\Delta V_T$ to be independent of $V_i$.

Further, choosing $V_{G1} = V_{G4}$, or specifically by equation (10a) with (11), $$V_{G1} = V_{G4} + \gamma_n[1 + (\gamma_p/\gamma_n)^2][\sqrt{V_{SS} + V_{ao} + 2\phi_p} - \sqrt{V_{SS} - V_{bo} + 2\phi_p}] \qquad (12)$$

reduces $\Delta V_T$ to zero, thereby eliminating the DC offset.

Thus, the choice of bias voltages given by equations (11) and (12) results in a VCT that is ideally linear and free of offset within the validity of MOS model used and of the approximations made. However, for realistic values of $\gamma_n$ and $\gamma_p$, the required well bias voltages are larger than $V_{DD}$, an inconvenience for practical implementations. A better solution is therefore the last choice mentioned above, that of W/L-ratioing. Inserting equation (10) into equation (4) gives an expression of the form $$I_o = a_1 + a_2 V_i + a_3 V_i^2 \qquad (13)$$

where $a_1$ is the DC offset current that after some algebra can be shown to equal $$a_1 = k_{eff}(V_{G1} + V_{G4} - \Sigma V_{To}) \Delta V_{To}. \qquad (14)$$

DC offset is eliminated by choosing $\Delta V_{To} = 0$, i.e., with $V_{G1} = -V_{G4}$, $V_{B2} = V_a$, and (10a) by satisfying the requirement $$V_{B4} = [(\gamma_n/\gamma_p)(\sqrt{V_{SS} + V_{ao} + 2\phi_p} - \sqrt{V_{SS} - V_{bo} + 2\phi_p}) + \sqrt{2|\phi_n|}]^2 - V_{bo} - 2|\phi_n| \qquad (15)$$

An offset zeroing method to set the well-voltage $V_{B4}$ to this value automatically is discussed below in the section entitled Offset Control.

Figure 4:
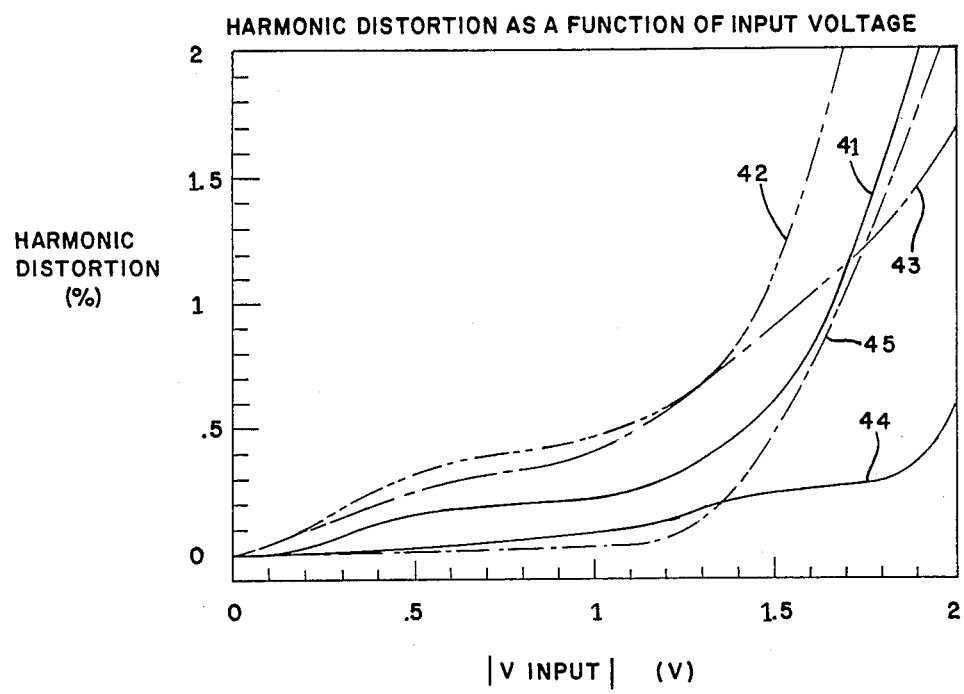
FIG. 4 shows the total harmonic distortion (THD) obtained from SPICE simulations of the circuits in FIG. 3b and FIG. 3c by controlling the non-linear behavior of the CMOS devices due to the body effect by width-/length ratioing.

With q and p defined in equation (10), the term $a_3$ in equation (13) can be shown to equal $$a_3 = q k_{eff}(1 - p/4) \qquad (16)$$

so that setting $q = 0$ will eliminate the nonlinear term. From (10b) with $V_{B2} = V_a$ this requirement results in $$\frac{\alpha}{1-\alpha} = \frac{\gamma_p}{\gamma_n} \sqrt{\frac{V_{SS} + V_{ao} + 2\phi_p}{V_{B4} + V_{bo} + 2|\phi_n|}} - \sqrt{\frac{V_{SS} + V_{ao} + 2\phi_p}{V_{SS} - V_{bo} + 2\phi_p}} \qquad (17)$$

where $V_{ao}$, $V_{bo}$ are functions of $\alpha$ with $\alpha/(1-\alpha) = \sqrt{k_p/k_n}$ from (9), and where $V_{B4}$ is chosen according to equation (15). Equation (17) may be solved for the ratio $k_n/k_p$ such that $a_3 = 0$ and the transconductance is ideally linear. SPICE simulations for several W/L-ratios for the p-channel and n-channel devices are shown in FIG. 4. Curve 41 shows the simulation results for $W_p/L_p = 30/10$ μm, curve 42 indicates the results when $W_p/L_p = 90/10$ μm and curve 43 indicates $W_p/L_p = 10/10$ μm, all for $W_n/L_n = 10/10$ μm, $V_{DD} = V_{SS} = V_G = 5$ V. Curve 44 is for the same device dimensions as curve 41 and is included to illustrate the method of extending the linear range by increasing the gate voltage sources (here $V_G = 6$ V). Finally, curve 45 shows the improved linearity that can be obtained in the complete absence of body effect as in SOS (silicon-on-sapphire) technology.

Figure 5:
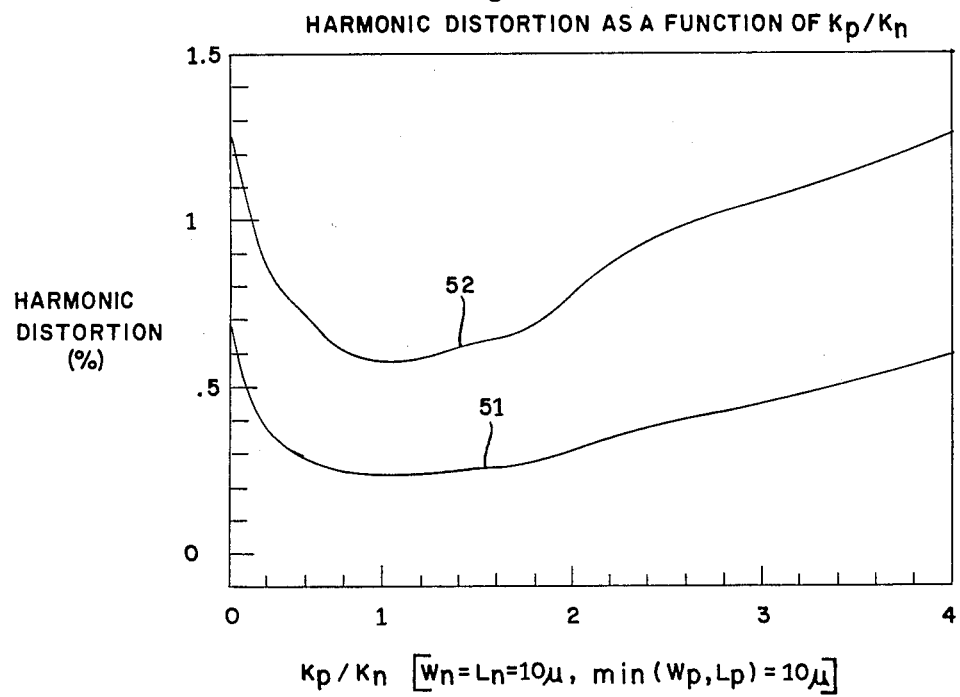
FIG. 5 is a plot of the results of SPICE simulation of the circuits in FIGS. 3b and 3c showing the THD as a function of $k_p/k_n$ for various peak-to-peak input voltages on $V_i$.

Total harmonic distortion (THD) for 1 V, curve 51, and 1.5 V, Curve 52, peak-to-peak input signals is shown in FIG. 5 as a function of $k_p/k_n$. It is seen that there is a range of W/L-ratios for the n-MOS and p-MOS devices where the VCT has excellent linearity (THD < 0.3% for up to 1 V peak-to-peak input signals) and that the exact value of $k_p/k_n$ for reasonable input signal levels is not critical, with the optimum being approximately $k_p/k_n = 1$, i.e., $W_p/W_n \approx 3$ for $L_n = L_p$.

FREQUENCY RESPONSE

Figure 6:
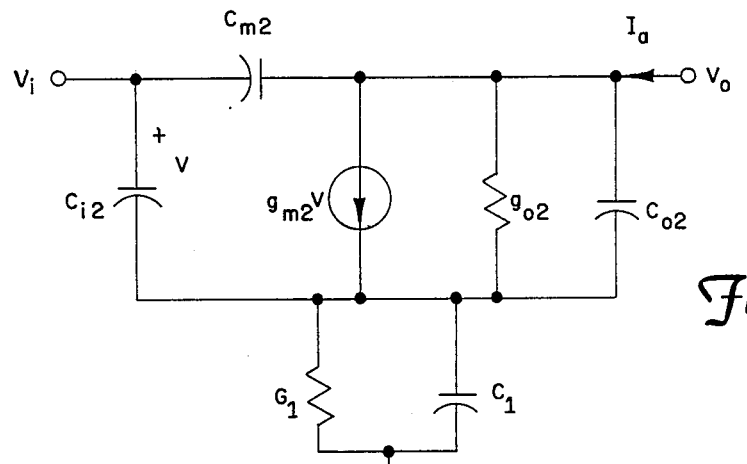
FIG. 6 shows the simplified small signal model of transistor pair $M_1/M_2$ which is identical to the small signal model for transistor pair $M_3/M_4$.

FIG. 6 shows a somewhat simplified small-signal model for the two devices M$_1$ and M$_2$ of FIG. 3. In FIG. 6, and in the following equations, the notation
$C_{ik} = C_{gs,k}$, $C_{mk} = C_{gd,k}$, $C_{ok} = C_{ds,k}$, $g_{ok} = \lambda_k I_{ds,k}$,
$G_k = g_{mk} + g_{ok}$, $C_k = C_{ik} + C_{ok}$, where $k = 1, 2$,
has been adopted for the elements. $g_{mk}$ is the appropriate small-signal transconductance parameter, e.g. $g_{m2} = k_p(V_{SG2} - |V_{Tp2}|)$, $\lambda_k$ models the effect of channel-length modulation, and $k_{n,p}$ was defined in equation (3). Straightforward analysis yields $$I_a \simeq \frac{G_1 g_{m2}}{G_1 + G_2} \frac{1 + s\frac{C_1}{G_1}\left[1 - \frac{C_{m2}}{C_1}\left(1 + \frac{G_1}{G_2}\right) - \frac{g_{o2}}{g_{m2}}\frac{C_{i2}}{C_1}\right]}{1 + s(C_1 + C_2)/(G_1 + G_2)} V_i + \tag{18}$$

$$\frac{G_1 g_{o2}}{G_1 + G_2} \frac{1 + s\frac{C_{m2}}{g_{o2}}\left[1 + \frac{G_2}{G_1} + \frac{C_{o2}}{C_{m2}} + \frac{g_{o2}}{G_1}\frac{C_1 + C_{i2}}{C_{m2}}\right]}{1 + s(C_1 + C_2)/(G_1 + G_2)} V_o$$

where terms proportional to $s^2$ in the numerator have been neglected because they become dominant only at unreasonably high frequencies. The small-signal model for M$_3$-M$_4$ and the expression for $I_b$ are identical to FIG. 6 and equation (18), with all subscripts changed appropriately. Thus, for $C_{mk} \ll C_{ik}$, $C_{ok} \ll C_{ik}$, $g_{ok} \ll g_{mk}$, and if for simplicity it can be assumed that M$_1$=M$_3$=M$_n$, M$_2$=M$_4$=M$_p$, the output current $I_o = -(I_a + I_b)$ is obtained as $$I_o \simeq -2\frac{g_{mn}g_{mp}}{g_{mn} + g_{mp}}\left\{\frac{1 + 0.5s(C_{in}/g_{mn} + C_{ip}/g_{mp})}{1 + s(C_{in} + C_{ip})/(g_{mn} + g_{mp})} V_i + \frac{1}{2}\left[\frac{g_{op}}{g_{mp}}\frac{1 + s\left[\frac{C_{in} + C_{ip}}{g_{mn}} + \frac{C_{op}}{g_{op}} + \frac{C_{mp}}{g_{op}}\left(1 + \frac{g_{mp}}{g_{mn}}\right)\right]}{1 + s(C_{in} + C_{ip})/(g_{mn} + g_{mp})} + \frac{g_{on}}{g_{mn}}\frac{1 + s\left[\frac{C_{in} + C_{ip}}{g_{mn}} + \frac{C_{on}}{g_{on}} + \frac{C_{mn}}{g_{on}}\left(1 + \frac{g_{mn}}{g_{mp}}\right)\right]}{1 + s(C_{in} + C_{ip})/(g_{mn} + g_{mp})}\right] V_o\right\} \tag{19}$$

If $g_o/g_m \ll 1$ as assumed, the $V_o$-dependent part is negligible, and $I_o$ is independent of frequency, $$I_o \simeq -g_{mT}V_i = -2\frac{g_{mn} \cdot g_{mp}}{g_{mn} + g_{mp}} V_i = -2\frac{g_{mn}}{1 + \sqrt{k_n/k_p}} V_i, \tag{20}$$

for $$C_{in}/C_{ip} = g_{mn}/g_{mp}. \tag{21}$$

If all transistors are in saturation, $C_i$ and $g_m$ for both device types can be expressed as $$C_i \simeq C_{ox} W d_{ov} + \tfrac{2}{3} C_{ox} WL \tag{22a}$$

$$g_m \simeq \sqrt{2\mu C_{ox}(W/L)I_{DS}} \tag{22b}$$

where $d_{ov}$ is the gate-to-source overlap. Assuming for simplicity $d_{ov} \ll L$, equation (21) with equation (22) results in the condition $$W_p L_p \simeq \sqrt{k_p/k_n} W_n L_n. \tag{23}$$

Thus, with the total transconductance $g_{mT}$ prescribed and the ratio $k_n/k_p$ known from equation (17), equation (20) may be solved for $$\frac{W_n}{L_n} = \frac{g_{mT}^2(1 + \sqrt{k_n/k_p})^2}{8\mu_n C_{ox} I_{DS}} \tag{24a}$$

to give the desired value of $g_{mT}$. Further, from equation (17), $$\tag{24b}$$

$$\frac{W_p}{L_p} = \left(\frac{\mu_n}{\mu_p}\frac{k_p}{k_n}\right)\frac{W_n}{L_n} = \frac{g_{mT}^2(1 + \sqrt{k_p/k_n})^2}{8\mu_p C_{ox} I_{DS}}$$

gives the best linearity and, from equation (23) with equation (24b), the values $$W_p = \sqrt{\mu_n/\mu_p}(k_p/k_n)^{\frac{3}{4}} W_n \tag{24c}$$

$$L_p = \sqrt{\mu_p/\mu_n}(k_n/k_p)^{\frac{1}{4}} L_n \tag{24d}$$

result in the best frequency-response. Finally, $W_n$ and $L_n$ are chosen as small as practical such that (24a) is satisfied. Note from FIG. 5 that the linearity minimum is quite flat (insensitive to $k_n/k_p$) and located at $k_p/k_n \simeq 1$. Thus, with $\mu_n/\mu_p \simeq 3$, the approximate optimal design is simply, for a suitable choice of $W_n$ and $L_n$, $$\frac{W_n}{L_n} \simeq \frac{g_{mT}^2}{2\mu_n C_{ox} I_{DS}} \quad \frac{W_p}{L_p} \simeq 3\frac{W_n}{L_n} \tag{25}$$

$$W_p/W_n \simeq \sqrt{3} \quad L_n/L_p \simeq \sqrt{3}$$

FIG. 7 contains the results of SPICE simulations showing the 3 dB-frequency of the short-circuit output current of the VCT in FIG. 3b with $W_p/W_n = 1.5$ as a function of $L_n/L_p$. Curve 71 of FIG. 7 shows the simulation results for the channel width $W_p = 15$ μm and the source and drain lengths $L_S = L_D = 10$ μm. Curve 72 indicates the simulation results obtained with $W_p = 15$ μm and $L_S = L_d = 15$ μm. Curve 73 represents $W_p = 30$ μm for $L_S=L_d=15$ μm. Evidently, the best frequency-response is obtained for the values specified by (25), verifying the analysis presented. As indicated in FIG. 7, without affecting the conclusions reached, the frequency-response depends also on the source and drain areas and perimeters, i.e., for a given width, on the chosen source and drain lengths, $L_S$ and $L_D$, an effect that is not included in the model of FIG. 6. Thus, as stated above, the devices should be chosen as small as practical if high frequencies are important.

Note that the SPICE results in FIG. 7 indicate 3 dB-frequencies well over 100 MHZ for fairly large devices. These results were obtained from a complete SPICE model, including source and drain capacitors and a well-to-substrate capacitance of 0.15 fF/μm$^2$ and thus may be considered to be realistic. The device dimensioning described above simply causes a cancellation of the dominant pole-zero pair so that high-order poles and zeros determine the frequency response. Thus, the circuit of FIG. 3a is a very fast extremely linear transconductance element.

OFFSET CONTROL

Figure 8:
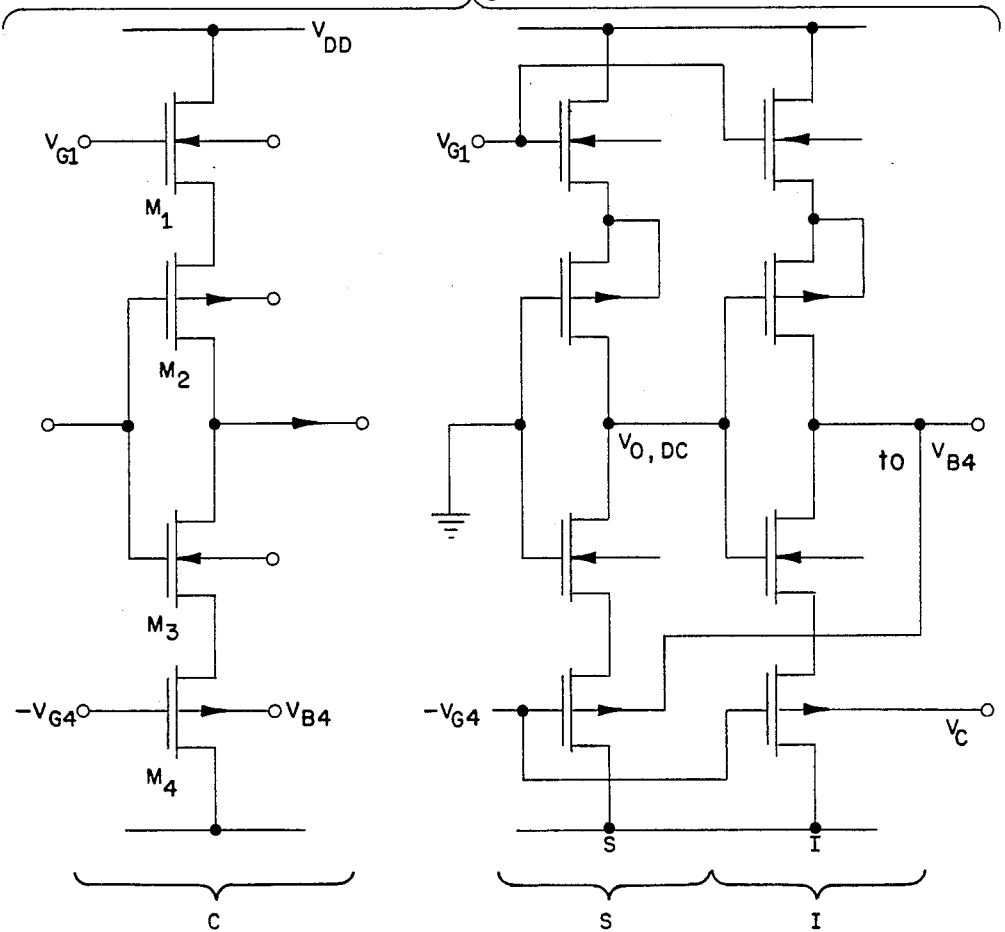
FIG. 8 shows a method of biasing the circuit of FIGS. 3b and 3c by use of appropriate n-well bias voltages to eliminate the output DC offset voltage.

It was shown in equation (15) that for $V_{B2}=V_a$ an appropriate choice of the n-well voltage $V_{B4}$ *will eliminate the output DC offset voltage*

$$V_{o,DC} = \tfrac{1}{2} g_{mT} R_o \Delta V_{To}$$

where $R_o$ represents the DC load of the VCT and $g_{mT}$ and $\Delta V_{To}$ were defined in (6) and (10a), respectively. FIG. 8 shows a simple offset control scheme, with stages C, S and I being a representative of the controlled stages, and a sensing and inverting stage, respectively, all of geometrically identical layout. If the sensor S has a DC offset $V_{o,DC}$ for $V_i=0$ and the inverter gain is $-A$, a voltage $V_{B4}=-AV_{o,DC}$ is returned to all the n-well terminals on the chip, resulting in $V_{o,DC}\approx 0$ for sufficiently large gain A. $V_c$ is adjusted externally or by separate on-chip circutry to eliminate any offset of stage I. ALL SPICE simulations of VCTs in this invention disclosure employed this offset control scheme with the resulting $V_{o,DC}<0.14$ mV for $A>100$.

TRANSCONDUCTANCE CONTROL

It was pointed out above that the transconductance $g_{mT}$ can be tuned by applying DC control voltages $V_{G1}=V_{G4}=V_G$ to the gates of $M_1$ and $M_4$. FIG. 9 shows a simple circuit for generating $V_G$ and $-V_G$ for this purpose. Neglecting channel-length modulation, straightforward analysis yields for $V_{DD}=V_{SS}$ $$V_G=(n-1)/nV_{DD}+(1)/nV_c.$$

Note that $V_G$ is independent of process parameter variations, but that the control voltage $V_c$ is attenuated by the factor 1/n and depends on the power supply voltage. If this causes problems, a more complicated circuit can be used that avoids these drawbacks, as is well known to those skilled in the art. FIG. 10 shows the variation of short circuit output current with $V_{DD}=-V_{SS}=12$ V, $W_p/L_p=30/30\mu$ and $W_n/L_n=10/30\mu$ when $V_G$ is varied from 6 V to 11 V in steps of 1V.

DETAILED DESCRIPTION OF THE ANALOG SEMI-CUSTOM ARRAY

An analog semi-custom design is the final goal to which this invention is addressed: to develop a sufficiently versatile analog master chip containing elementary linear analog cell (ELAC) arrays that can be customized by one or more metal layers for specific analog signal processing needs. The transconductance element (VCT) described in this invention forms the foundation of this analog semi-custom array. This VCT is implemented in CMOS technology which is compatible with digital circuitry so that if needed, digital gates for control, interfacing or other functions can be integrated on the same IC. This VCT is small and allows for high analog functional density. The VCT arrays can be "programmed" by metal layers and applied control signals to implement a wide range of specifications with the same chip.

The aforementioned VCT is selected as the ELAC forming the foundation of the analog functional building blocks for the analog semi-custom array in the present invention. The VCT-ELAC is used to build a wide variety of circuit components to implement analog functions. By example but not by limitation, the following general purpose continuous-time signal processing circuits can be implemented using the VCT-ELAC: multipliers, operational transconductance amplifiers, gyrators, resistors, buffers, gain stages, low-pass, high-pass, band-pass, all-pass, and band rejection filters along with phase, delay, and magnitude equalizers. All analog components must be electronically variable to allow tuning and automatic compensation against component drifts. The VCT of the present invention is a suitable ELAC because numerous analog building blocks can be implemented by VCTs as shown below.

Figure 11:
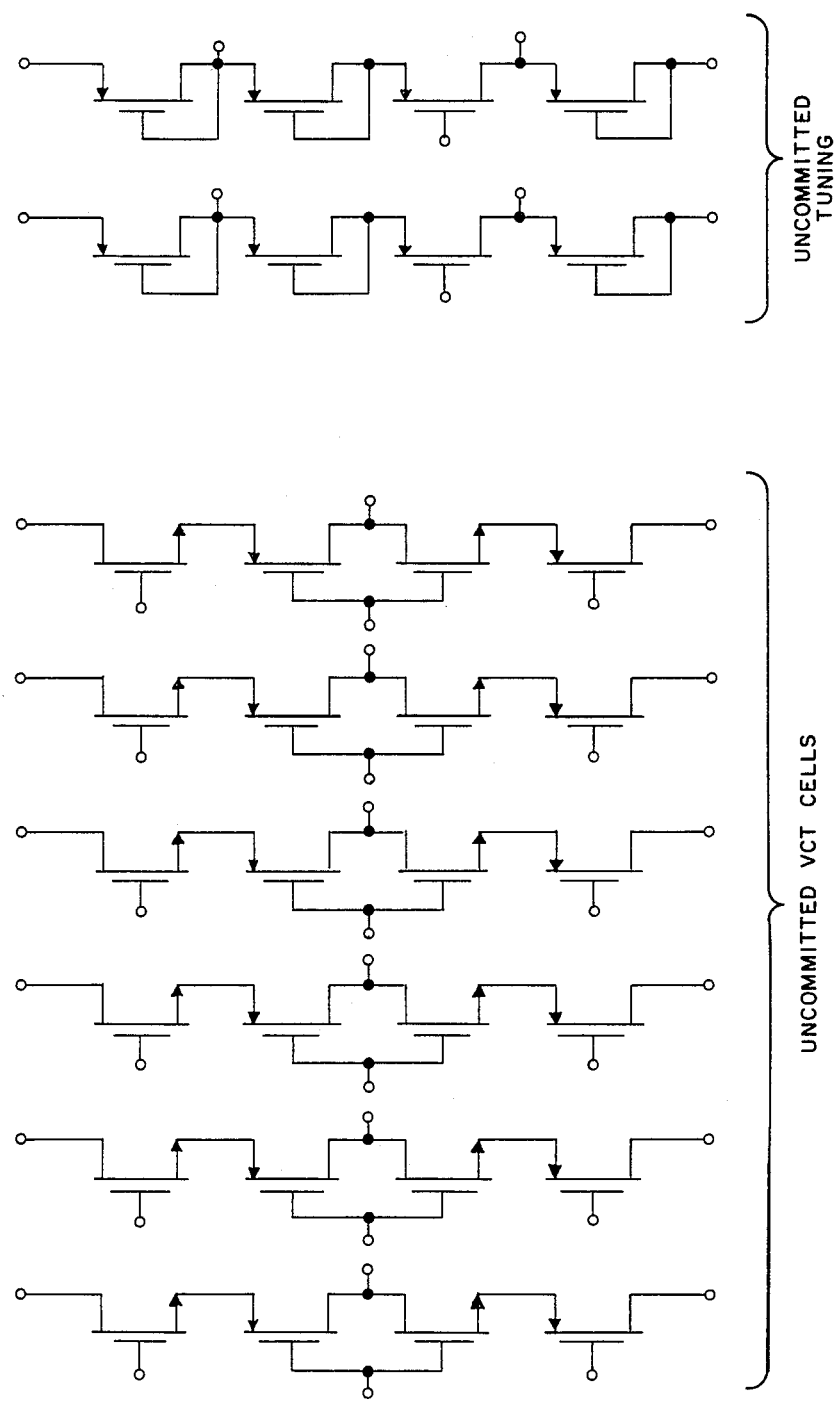
FIG. 11 shows an array of the circuits found in FIGS. 3b and 3c including several tuning circuits of the type found in FIG. 9. This is a schematic example of how a plurality of uncommitted VCT cells could be implemented.

FIG. 11 shows an example of a group of uncommitted VCT cells. These cells are composed of the aforementioned n-channel/p-channel matched pairs that form the tunable VCT. The cells are fabricated in a regular array structure using CMOS process techniques well known in the semiconductor art. The internal cell connections may be made by metal, polysilicon, or other interconnect techniques known in the art. The cells can be interconnected by forming metal layers over the top of the uncommitted cells in order to implement the semi-custom designs. On the right of FIG. 11 are shown two uncommitted tuning cells. These cells can be used to select the tuning voltage of the VCTs. Several of the uncommitted VCT cells may also be assigned to an offset control circuit to provide the appropriate n-well bias voltage to eliminate output DC offset voltage.

VCT-ELAC ARRAY BUILDING BLOCKS

This section illustrates the realization of several analog circuit components that can be realized by merely interconnecting the VCT-ELACs described above. The following list of components is by no means exhaustive since they are shown by example and not by limitation. The following discussion should serve as an illustration of the potential of this approach.

Figure 12:
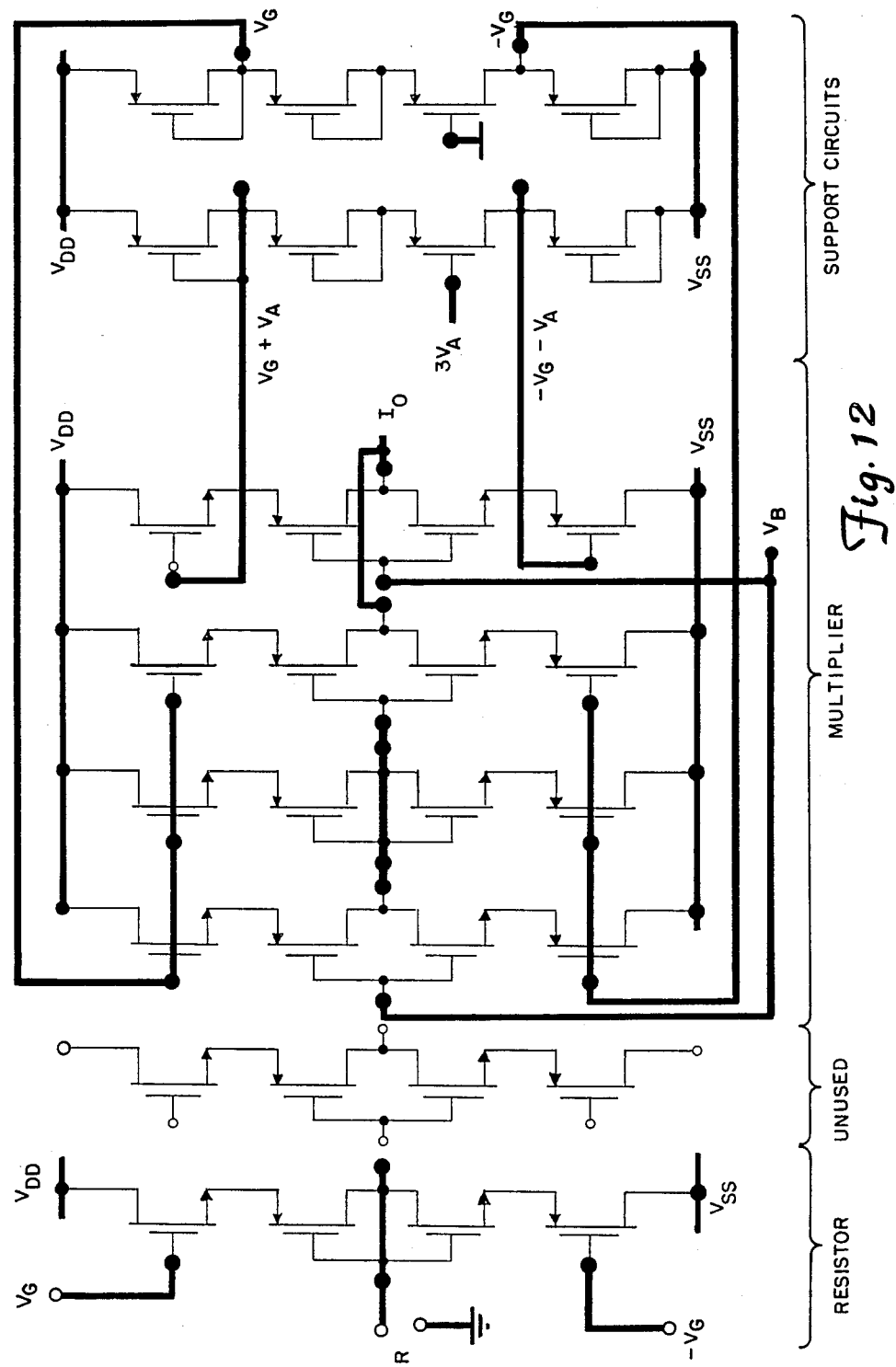
FIGS. 12 through 15 show a few of the possible implementations that can be achieved with the array shown in FIG. 11.

FIGS. 12–15 depict a "VCT-ELAC array chip" and the fat lines depict the interconnections ("metal layers") necessary to implement a number of analog building blocks. Also included for illustration purposes are some areas for support circuitry, such as for $\pm V_G$ generation (FIG. 12). Capacitor arrays, switching arrays (transmission gates), and input and output buffers are not shown but are well-known in the semiconductor art and are assumed to be included in this array. Each building block is described briefly below.

A. Linear Tunable Grounded Resistor

FIG. 12 (left side) shows a resistor of value $R = g_m^{-1}$, with $g_m$ given in equation (6). The frequency response is as that of $g_m$ in FIG. 7.

B. Implementing Offset Control

Figure 14:
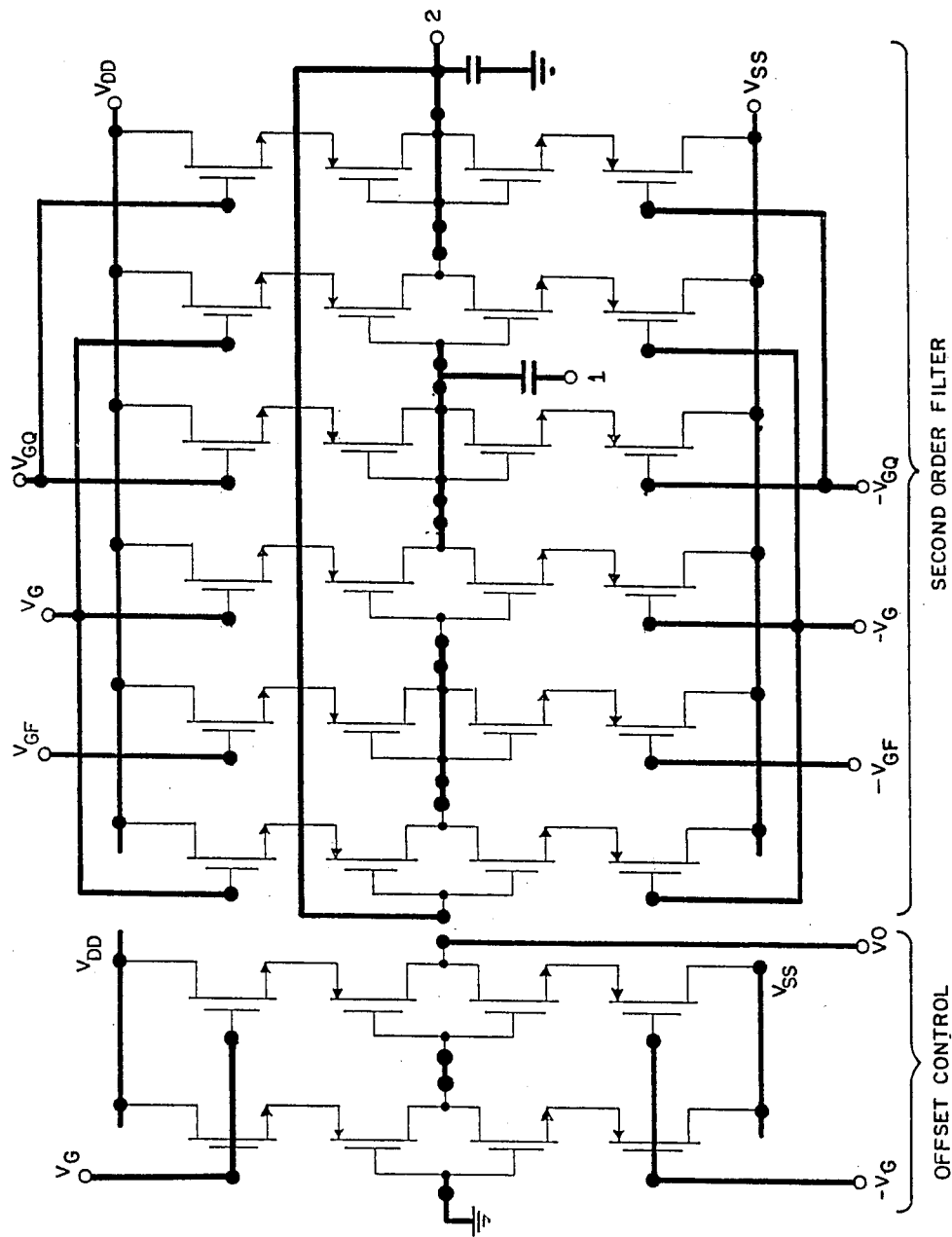

FIG. 14 (left side) illustrates DC offset control: under the assumption of n-well technology, $V_0$ is connected to all lower n-well terminals (not shown). It has been shown above that this feedback control scheme reduces DC offset to a fraction of a millivolt in all ELACs.

C. Four Quadrant Multiplier

FIG. 12 (middle) shows the connections for a four-quadrant multiplier cell realizing $I_o = 4k_{eff}V_AV_B$. Applying $I_o$ to the resistor shown on the left of FIG. 12 results in an output voltage, if needed.

D. Operational Transconductance Amplifier—OTA

Figure 13:
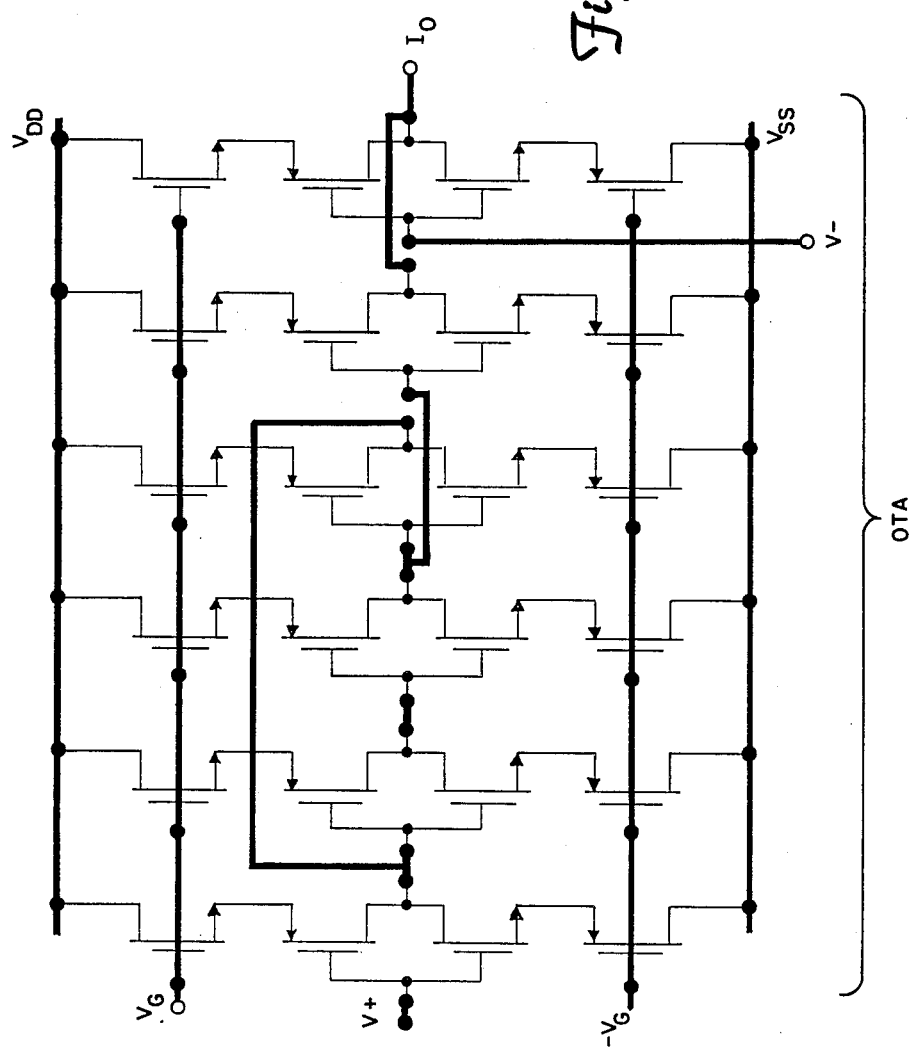

OTAs are very useful elements in active filter design. FIG. 13 shows one possibility of many for implementing such a device with VCT-cells. The OTA realizes $$I_o = g_m(V^+ - V^-)$$

with $g_m$ given in equation (6) above. The circuit is designed to exhibit excellent linearity, common-mode rejection, and frequency-range.

E. Gyrator

Figure 15:
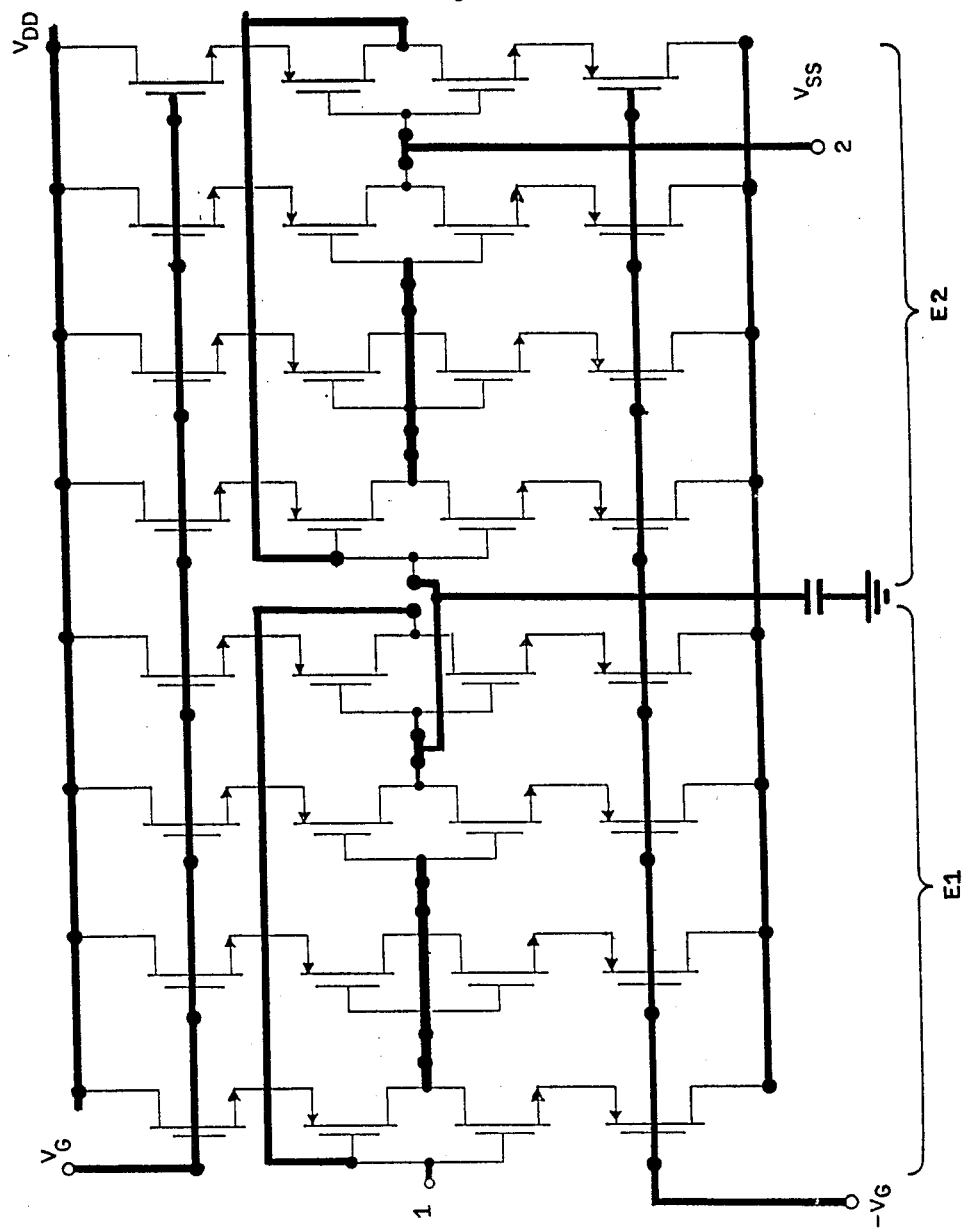

High-quality filters need inductors to facilitate resonance. Inductors in IC form, of course, are simulated by use of gyrators as shown in FIG. 15, Part E1 (grounded inductor, between terminals 1 and ground) and Parts E1 and E2 (floating inductor, between terminals 1 and 2). The performance of FIG. 15 Part E1 is described with $$Z_L^{-1} = (j\omega L + R_L)^{-1} + j\omega C_p$$

where $L = C/g_m^2$, $R_L = g_o/g_m^2$, and where $C_p$ is the parasitic input capacitor and $g_o$ the finite output conductance of the VCT-cell. High-quality inductors, $Q > 100$, for frequencies into the MHz-range can be built.

F. Second-order Filter

FIG. 14 (right side) shows the circuit for a second-order bandpass filter realizing a function of the form $$V_2/V_1 = as/(s^2 + bs + c)$$

where b and c are controllable by the Q-control voltage $V_{GQ}$ and the frequency control voltage $V_{GF}$, respectively.

The above examples should be sufficient to illustrate the possibilities of the VCT-ELAC array. Other building blocks are possible. It should be apparent that with the availability of gyrators one can implement floating resistors and transformers, OTAs (or second-order filters) will allow the realization of oscillators, and OTAs can also be used to construct operational amplifiers, comparators, and inverting or non-inverting transconductances.

In a few cases, apparently complicated implementations of building blocks are caused, of course, by the attempt to realize everything by interconnecting identical ELACS. Note too, that all components are constructed using *only* transistors and, in some cases, capacitors. It is pointed out again that all elements are electronically tunable by applying the necessary bias voltages. FIG. 14 (left side) shows one easy method to realize the required voltages $V_G$ and $-V_G$, or $V_A$ and $-V_A$ for the multiplier.

The capacitors needed in most analog signal-processing circuits (FIGS. 14 and 15) are, of course, implemented as a capacitor array as is customary in switched-capacitor filters.

Although specific electrical and physical configurations have been illustrated and described for the preferred embodiment of the CMOS analog standard cell and the linear transconductance element, it will be appreciated by those of ordinary skill in the art that any conventional electrical or physical arrangement which is calculated to achieve the same purpose may be substituted for the specific configurations shown. Thus, although VLSI design is the generally preferred embodiment of the present invention, the devices described herein may be implemented through the use of conventional components in a greater or lesser degree in MSI and SSI designs. Additionally, although p-type and n-type enhancement mode MOSFET transistors have been described and implemented in a CMOS environment for purposes of the preferred embodiment of the present invention, it will be appreciated by those skilled in the art that depletion mode MOS transistors or junction field effect tansistors may be substituted therefor. In addition, the field effect transistors may be fabricated in either silicon or gallium arsenide substrate material. Also, MESFET transistors are possible candidates for the implementation of the foregoing invention. Other fabrication techniques will also be apparent to those skilled in the art that lend themselves to the matching of the n-type and p-type transistors as well as suppressing many of the nonlinearities of the transistors and composite transistors by means well biasing, twin tub processing, and silicon-on-sapphire. Also, although CMOS metal gate technology has been described in the present application, silicon gate FET transistors can also be used interchangeably.

While the present invention has been described in connection with the preferred embodiment thereof, it will be understood that many modifications will be readily apparent to those of ordinary skill in the art, and this application is intended to cover any adaptations or variations thereof. Therefore, it is manifestly intended that this invention be limited only by the claims and the equivalents thereof.

What is claimed is:

1. A linear voltage to current transducer, comprising:
   a first composite transistor including a first n-type field effect transistor having gate, drain and source terminals, and a first p-type field effect transistor having gate, drain and source terminals, and having the source terminal of said first n-type transistor connected to the source terminal of said first p-type transistor;
   a second composite transistor including a second n-type field effect transistor having gate, drain and source terminals, and a second p-type field effect transistor having gate, drain and source terminals, and having the source terminal of said second n-type transistor connected to the source terminal of said second p-type transistor;
   said second n-type transistor being matched to said first n-type transistor and said second p-type transistor being matched to said first p-type transistor;
   signal output connected to one of the gate terminals of said first composite transistor and further connected to one of the gate terminals of said second composite transistor;
   first tuning voltage means connected to the other one of said gate terminals of said first composite transistor and second tuning voltage means connected to the other one of said gate terminals of said second composite transistor for biasing the n-type and p-type transistors in constant saturation, for biasing the transducer into linear operation and for controlling the gain of the transducer; and output terminal connected to the drain terminal of said first p-channel transistor and further connected to the drain terminal of said second n-channel transistor for supplying the output current difference between said first and second composite transistors so that the current difference is linearly proportional to the amount of a large-signal input voltage placed on said signal input.

2. The transducer according to claim 1 wherein said n-channel and p-channel transistors are well-biased whereby the non-linear body effect is suppressed.

3. The transducer according to claim 1 wherein said first tuning voltage is equal in magnitude and opposite in polarity to said second tuning voltage.

4. The circuit according to claim 1 wherein the transistors are fabricated using silicon-on-sapphire such that wells are not required for said transistors.

5. The circuit according to claim 1 wherein said n-channel and p-channel transistors are fabricated with width-to-length ratios conforming to the formula $$\frac{\alpha}{1-\alpha} = \frac{\gamma_p}{\gamma_n} \sqrt{\frac{V_{SS} + V_{ao} + 2\phi_p}{V_{B4} + V_{bo} + 2|\phi_n|}} -$$

$$\sqrt{\frac{V_{SS} + V_{ao} + 2\phi_p}{V_{SS} - V_{bo} + 2\phi_p}}$$

whereby the non-linear body effect is suppressed.

6. An improved linear transconductance circuit comprising:

a first composite transistor including a first n-channel and a first p-channel field effect transistors each having gate, drain and source terminals;

a second composite transistor including a second n-channel and a second p-channel field effect transistors each having gate, drain and source terminals;

said second n-channel transistor being matched to said first n-channel transistor and said second p-channel transistor being matched to said first p-channel transistor;

the source terminal of said first n-channel transistor being connected to the source terminal of said first p-channel transistor, the drain terminal of said first p-channel transistor being connected to the drain terminal of said second n-channel transistor, and the source terminal of said second n-channel transistor being connected to the source terminal of said second p-channel transistor;

a first supply voltage connected to the drain terminal of said first n-channel transistor;

a second supply voltage connected to the drain terminal of said second p-channel transistor;

a first tuning voltage means connected to the gate terminal of said first n-channel transistor and second tuning voltage means connected to the gate terminal of said second p-channel transistor for adjusting the gain of the circuit and for maintaining all transistors in constant saturation;

a signal input connected to the gate terminal of said first p-channel transistor and further connected to the gate terminal of said second n-channel transistor, said signal input operable for receiving a large-signal voltage and for controlling the channel currents of said first and second composite transistors in response thereto; and a current output terminal connected to the drain terminal of said first p-channel transistor and further connected to the drain terminal of said second n-channel transistor, said output terminal operable for supplying the output current difference between said first and second composite transistor such that the current difference is linearly proportional to the amount of said large-signal voltage placed on said signal input.

7. The circuit according to claim 6 wherein said n-channel and p-channel transistors are fabricated in their own wells respectively whereby the non-linear body effect inherent in CMOS transistors is suppressed.

8. The circuit according to claim 7 wherein said n-channel and p-channel transistors are well-biased whereby the non-linear body effect is suppressed.

9. The circuit according to claim 6 wherein said n-channel and p-channel transistors are fabricated with width-to-length ratios conforming to the formula $$\frac{\alpha}{1-\alpha} = \frac{\gamma_p}{\gamma_n} \sqrt{\frac{V_{SS} + V_{ao} + 2\phi_p}{V_{B4} + V_{bo} + 2|\phi_n|}} -$$

$$\sqrt{\frac{V_{SS} + V_{ao} + 2\phi_p}{V_{SS} - V_{bo} + 2\phi_p}}$$

whereby the non-linear body effect is suppressed.

10. The circuit according to claim 6 wherein one of said supply voltages is placed at ground potential in reference to the other of said supply voltages.

11. The circuit according to claim 6 wherein said first tuning voltage is substantially equal in magnitude and opposite in polarity to said second tuning voltage.

12. The circuit according to claim 6 further including a voltage divider chain of metal-oxide-semiconductor transistors placed between said first supply voltage and said second supply voltage, said chain having a plurality of taps wherein said tuning voltage is derived from said taps.

13. The circuit according to claim 6 wherein the transistors are fabricated using silicon-on-sapphire such that wells are not required for said transistors.

14. A linear semi-custom analog integrated circuit chip including input and output signal pins, for continuous-time signal processing applications comprising:

a plurality of capacitors;
a plurality of input buffers;
a plurality of output buffers;
a plurality of analog cells for building analog signal processing circuits on said chip, each of said analog cells comprising:
a first composite transistor including a first n-channel and first p-channel field effect transistors each having gate, drain and source terminals;
a second composite transistor including a second n-channel and second p-channel field effect transistors each having gate, drain and source terminals;
said second n-channel transistor being matched to said first n-channel transistor and said second p- channel transistor being matched to said first p-channel transistor;

the source terminal of said first n-channel transistor connected to the source terminal of said first p-channel transistor, the drain terminal of said first p-channel transistor connected to the drain terminal of said second n-channel transistor, and the source terminal of said second n-channel transistor connected to the source terminal of said second p-channel transistor;

a first supply voltage connected to the drain terminal of said first n-channel transistor;

a second supply voltage connected to the drain terminal of said second p-channel transistor;

a first tuning voltage connected to the gate terminal of said first n-channel transistor;

a second tuning voltage connected to the gate terminal of said second p-channel transistor;

said turning voltages operable for maintaining the n-channel and p-channel transistors in constant saturation;

signal input connected to the gate terminal of said first p-channel transistor and further connected to the gate terminal of said second n-channel transistor, said signal input operable for receiving a large-signal voltage and for controlling the channel currents of said first and second composite transistors in response thereto; and current output terminal connected to the drain terminal of said first p-channel transistor and further connected to the drain terminal of said second n-channel transistor, said output terminal operable for supplying the output current difference between said first and second composite transistors such that the current difference is linearly proportional to the amount of said large-signal voltage placed on said signal input; and metal interconnect means for connecting said capacitors, input buffers, output buffers, input pins, output pins, signal inputs and current output terminals, such that semi-custom analog functions may be created based solely upon the pattern of said metal interconnect.

15. The circuit according to claim 14 wherein said n-channel and p-channel transistors are fabricated in their own wells respectively whereby the non-linear body effect inherent in CMOS transistors is suppressed.

16. The circuit according to claim 14 wherein said n-channel and p-channel transistors are well-biased whereby the non-linear body effect is suppressed.

17. The circuit according to claim 14 wherein said n-channel and p-channel transistors are fabricated with width-to-length ratios whereby the non-linear body effect is suppressed.

18. The circuit according to claim 14 wherein one of said supply voltages is placed at ground potential in reference to the other of said supply voltages.

19. The circuit according to claim 14 wherein said first tuning voltage is substantially equal in magnitude and opposite in polarity to said second tuning voltage.

20. The circuit according to claim 14 further including a voltage divider chain of metal-oxide-semiconductor transistors placed between said first supply voltage and said second supply voltage, said chain having a plurality of taps along said chain wherein said tuning voltage is derived from said taps.

21. The circuit according to claim 14 wherein said transistors are fabricated in silicon-on-sapphire technology such that wells for said transistors are not required.

22. The circuit according to claim 14 wherein said n-channel and p-channel transistors are fabricated with width-to-length ratios conforming to the formula $$\frac{\alpha}{1-\alpha} = \frac{\gamma_p}{\gamma_n} \sqrt{\frac{V_{SS} + V_{ao} + 2\phi_p}{V_{B4} + V_{bo} + 2|\phi_n|}} - \sqrt{\frac{V_{SS} + V_{ao} + 2\phi_p}{V_{SS} - V_{bo} + 2\phi_p}}$$

whereby the non-linear body effect is suppressed.

23. A linear semi-custom analog integrated circuit chip including input and output signal pins, for continuous-time signal processing application comprising:

a plurality of analog cells for building analog signal processing circuits on said chip, each of said analog cells comprising:

a first composite transistor including a first n-type field effect transistor having gate, drain and source terminals, and a first p-type field effect transistor having gate, drain and source terminals, and having the source terminal of said first n-type transistor connected to the source terminal of said first p-type transistor;

a second composite transistor including a second n-type field effect transistor having gate, drain and source terminals, and a second p-type field effect transistor having gate, drain and source terminals, and having source terminal of said second n-type transistor connected to the source terminal of said second p-type transistor;

said second n-type transistor being matched to said first n-type transistor and said second p-type transistor being matched to said first p-type trnasistor;

at least one signal input means connected to at least one of the gate terminals of at least one of said composite transistors for controlling the current through said composite transistors;

variable biasing means connected to at least one of the gate terminals of at least one of said composite transistors for biasing all of said n-type and p-type transistors in constant saturation and for adjusting the transconductance;

current differencing means connected between said first composite transistor and said second composite transistor for generating a current output in proportion to the difference between the currents flowing through said first and second composite transistors in linear response to large-signal voltages applied to said at least one signal input means; and metal interconnect means for connecting said input pins, output pins, signal input means and current differencing means, such that semi-custom analog functions may be created based solely upon the pattern of said metal interconnect means.

24. The circuit according to claim 23 wherein said n-channel and p-channel transistors are fabricated with width-to-length ratios conforming to the formula $$\frac{\alpha}{1-\alpha} = \frac{\gamma_p}{\gamma_n} \sqrt{\frac{V_{SS} + V_{ao} + 2\phi_p}{V_{B4} + V_{bo} + 2|\phi_n|}} - \sqrt{\frac{V_{SS} + V_{ao} + 2\phi_p}{V_{SS} - V_{bo} + 2\phi_p}}$$

whereby the non-linear body effect is suppressed.

* * * * *